United States Patent
Nakano et al.

(10) Patent No.: US 11,316,516 B2
(45) Date of Patent: Apr. 26, 2022

(54) CIRCUIT FAULT DETECTION APPARATUS

(71) Applicant: DENSO CORPORATION, Kariya (JP)

(72) Inventors: Yuichiro Nakano, Kariya (JP); Yohei Nakakura, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 17/203,388

(22) Filed: Mar. 16, 2021

(65) Prior Publication Data
US 2021/0203321 A1 Jul. 1, 2021

Related U.S. Application Data

(63) Continuation of application No. PCT/JP2019/028996, filed on Jul. 24, 2019.

(30) Foreign Application Priority Data

Sep. 18, 2018 (JP) .............. JP2018-174046

(51) Int. Cl.
| | |
|---|---|
| H03K 17/687 | (2006.01) |
| H02M 1/08 | (2006.01) |
| G01R 19/165 | (2006.01) |
| G01R 31/28 | (2006.01) |
| H03K 17/081 | (2006.01) |

(52) U.S. Cl.
CPC ......... *H03K 17/687* (2013.01); *G01R 19/165* (2013.01); *H02M 1/08* (2013.01); *H03K 17/08104* (2013.01)

(58) Field of Classification Search
CPC .............. G01R 19/16571; G01R 31/2884
USPC ........................................... 702/58
See application file for complete search history.

(56) References Cited

U.S. PATENT DOCUMENTS

2021/0208195 A1* 7/2021 Nakano ............... H02M 1/32

FOREIGN PATENT DOCUMENTS

| JP | H10256541 A | 9/1998 |
|---|---|---|
| JP | 2000134955 A | 5/2000 |

OTHER PUBLICATIONS

U.S. Appl. No. 17/203,453, filed Mar. 16, 2021, Yuichiro Nakano et al.

* cited by examiner

*Primary Examiner* — Kenneth B Wells
(74) *Attorney, Agent, or Firm* — Harness, Dickey & Pierce, P.L.C.

(57) ABSTRACT

A circuit fault detection apparatus includes an AD conversion circuit, a corrector, first and second determination devices, and a fault detector. The AD conversion circuit detects a voltage corresponding to a current or a voltage applied to the circuit fault detection element, and converts the voltage to a digital value. The corrector corrects a measurement value to a corrected measurement value. The first determination device determines whether or not the electric circuit has the fault, based on a comparison between an uncorrected measurement value and an uncorrected threshold value. The second determination device determines whether the electric circuit has the fault, based on a comparison between the corrected measurement value and a corrected threshold value. The fault detector detects the fault in the electric circuit, based on a condition that at least one of the first or second determination devices determines that the electric circuit has the fault.

6 Claims, 5 Drawing Sheets

CIRCUIT FAULT DETECTION APPARATUS

CROSS REFERENCE TO RELATED APPLICATIONS

The present application is a continuation application of International Patent Application No. PCT/JP2019/028996 filed on Jul. 24, 2019, which designated the U.S. and claims the benefit of priority from Japanese Patent Application No. 2018-174046 filed on Sep. 18, 2018. The entire disclosures of all of the above applications are incorporated herein by reference.

TECHNICAL FIELD

The present disclosure relates to a circuit fault detection apparatus for detecting a fault in an electric circuit.

BACKGROUND

An overcurrent detection circuit may detect an overcurrent. A current value measured through a shunt resistor may be converted to a voltage value, and then a digital value for indicating the voltage value may be read through an AD conversion circuit.

SUMMARY

The present disclosure describes a circuit fault detection apparatus for detecting a fault in an electric circuit. The circuit fault detection apparatus includes an AD conversion circuit, a corrector, first and second determination devices, and a fault detector.

BRIEF DESCRIPTION OF DRAWINGS

Other objects, features and advantages of the present disclosure will become more apparent from the following detailed description made with reference to the accompanying drawings. In the drawings.

DETAILED DESCRIPTION

Figure 1:
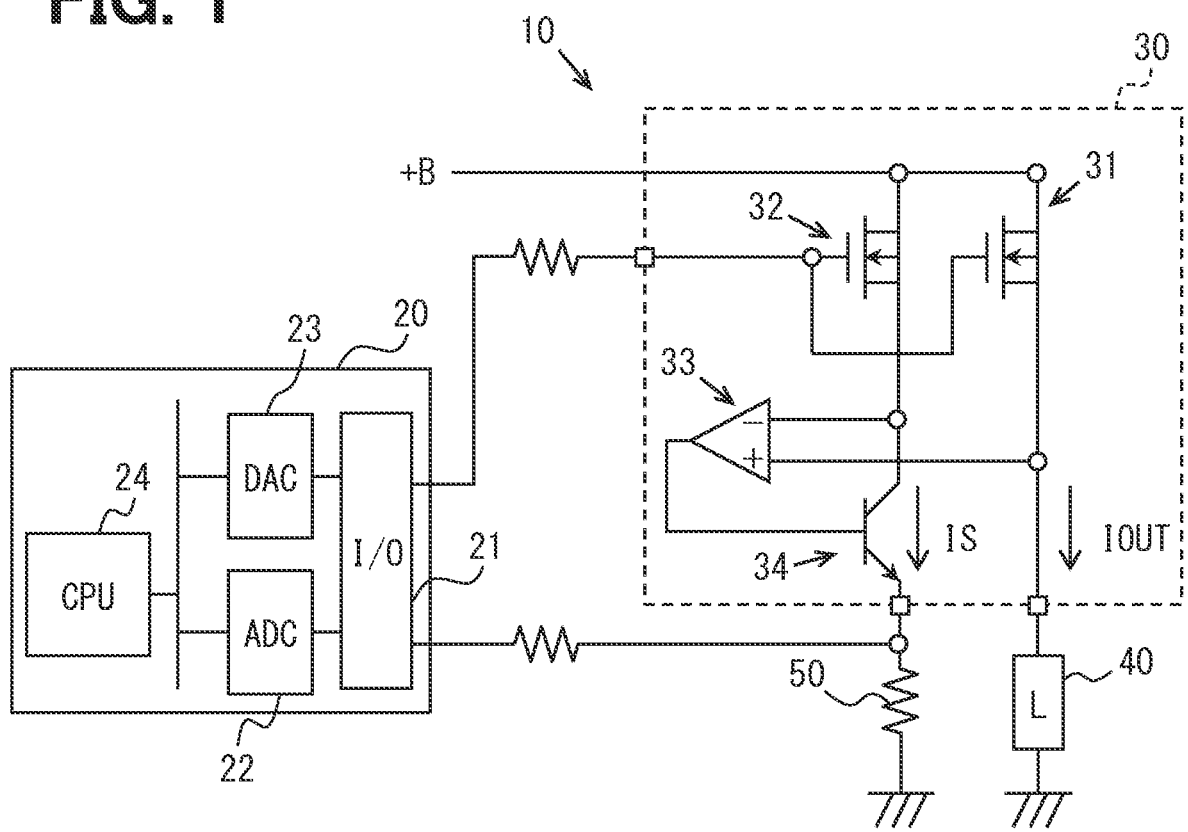
FIG. 1 illustrates a configuration of an electric circuit and an MPU.

For detecting an overcurrent, a digital value indicating a measured voltage value may be compared with a threshold value. The correspondence relational expression, which indicates a correspondence relation between a measured voltage value or a current value corresponding to the measured voltage value and a digital value, is a straight line. The slope of the straight line may be adjusted by changing the value of a catalog resistor value (hereinafter referred to as a catalog value) of a utilized resistor. In view of individual difference, the relation between the measured voltage value or the current value corresponding to the measured voltage value and the digital value may be required to be corrected individually.

For enhancing detection resolution of the voltage value and the current value corresponding to the voltage value, the slope of the correspondence relational expression may be enlarged to some extent. Therefore, it may be required to utilize a resistor having a resistance value that increases the slope of the correspondence relational expression to some extent.

The threshold value for detecting an overcurrent is a value at which an overcurrent can be detected in a situation where the normal current value slightly exceeds the threshold value. In view of the above, it may be preferable to have a lower threshold value.

Since the resistor has a temperature dependence, the relation between the voltage value detected by the resistor or the current value corresponding to the voltage value and the digital value also has the temperature dependence. In other words, even though the current value is the same as normal, the output digital value may fluctuate. Therefore, there may be a limit to lower the threshold value.

On the other hand, if the threshold value is set to an excessively high value, the overcurrent may not be detected in many situations. Therefore, it may not be preferable to set the threshold value too high.

In a situation of detecting the overcurrent, it may be required to set the threshold value in a range so that the normal current value is not erroneously detected as the overcurrent even if individual differences are taken into consideration while the overcurrent can be detected promptly.

Since it may be time or labor consuming for setting the threshold value for each individual, the threshold value may be set to a common value regardless of each individual. In a situation where the threshold value is a common value not depending on the individual, the correspondence relational expression may be set as the resistance value of the resistor being the catalog value, and may be set based on the correspondence relational expression.

The range of the magnitude of the analog signal that the AD conversion circuit can convert into a digital value is fixed. As the slope of the correspondence relational expression is larger, the digital value corresponding to the voltage value may easily reach the upper limit of the digital value that can be output by the AD conversion circuit. In a situation where the digital value corresponding to the voltage value exceeds the upper limit of the digital value which can be output by the AD conversion circuit, the upper limit value is output regardless of the magnitude of the measured voltage value. As the voltage value represented by the threshold value is higher than the voltage value represented by the upper limit value of the digital value, the overcurrent cannot be detected. Therefore, it may be required that the voltage value represented by the threshold value is smaller than the upper limit value of the digital value.

In a situation where the slope of the correspondence relational expression is reduced, since the digital value corresponding to the identical voltage value becomes a smaller value, the voltage value represented by the threshold value does not easily exceed the voltage value represented by the upper limit value of the digital value. In other words, for setting the voltage value represented by the threshold value to be smaller than the voltage value represented by the upper limit value of the digital value, the slope of the correspondence relational expression may be set to be smaller. However, as described above, the slope of the correspondence relational expression cannot be set to be very small due to detection resolution.

As a resistor is used for voltage measurement and the resistance value of the resistor has an individual difference, it may be required to individually correct the relation between the measured voltage value or the current value corresponding to the measured voltage value and the digital value.

The corrected value becomes a value measured in a situation where the resistance value is a catalog value through correcting the actual acquired digital value. Therefore, it is possible to compare the resistance value, which is set as the catalog value, with the threshold value.

By correcting the actual acquired digital value, it is possible to compare with the threshold value set so as not to exceed the voltage value represented by the upper limit value of the digital value. However, the correction may not prevent the digital value from not reaching the upper limit. In a situation where the digital value does not reach the upper limit value, the digital value merely becomes a value which is comparable with the threshold value through correction. Whether or not the digital value reaches the upper limit depends on the resistance value that varies on each individual. In a situation of evaluating the correspondence relational expression indicating the relation between the measured voltage value and the digital value, for an individual with a larger slope of the correspondence relational expression, the upper limit value of the digital value may be lower than the threshold preliminarily set in a situation of the resistance value being the catalog value.

In a device in which the threshold value is preliminarily set and the overcurrent is detected by comparing the digital value acquired by the AD conversion circuit with the threshold value, it is possible that the upper limit of the digital value does not exceed the threshold value and the overcurrent cannot be detected.

The above description relates to difficulties in the overcurrent detection apparatus as an example. However, it may be desirable to detect a disconnection in the circuit. In the circuit fault detection apparatus for detecting the disconnection in the circuit, the digital value may be compared with a threshold value set for detecting the disconnection. The circuit disconnection is detected in a situation where the digital value becomes lower than the threshold value.

Since there is a range in the magnitude of the analog signal in which the AD conversion circuit can convert into the digital value, there is also a lower limit for the magnitude of the analog signal convertible to the digital value through the AD conversion circuit. Similar to the situation of detecting the overcurrent, in a device in which the threshold value is preliminarily set and the circuit disconnection is detected by comparing the digital value acquired by the AD conversion circuit with the threshold value, it is possible that the upper limit of the digital value does not exceed the threshold value and the overcurrent cannot be detected.

Since the value directly detected by the AD conversion circuit is a voltage value, the difficulties may occur in a situation of detecting the overcurrent and in a situation of detecting the circuit disconnection if the circuit fault detection apparatus for detecting a fault of the current value is adopted.

According to an aspect of the present disclosure, a circuit fault detection apparatus includes an AD conversion circuit, a corrector, a first determination device, a second determination device, and a fault detector. The AD conversion circuit detects a voltage corresponding to a current flowing through a circuit fault detection element connected to the electric circuit or a voltage applied to the circuit fault detection element, and converts the voltage to a digital value. The corrector corrects a measurement value as the digital value output by the AD conversion circuit or a voltage value representative of the digital value to a corrected measurement value as a value in a situation where a resistance value of the circuit fault detection element is preliminarily set to a standard resistance value. The first determination device determines whether or not the electric circuit has the fault, based on a comparison between the measurement value and an uncorrected threshold value for determining whether or not the uncorrected measurement value has the fault. The measurement value is an uncorrected measurement value before corrected by the corrector. The second determination device determines whether or not the electric circuit has the fault, based on a comparison between the corrected measurement value and a corrected threshold value for determining whether or not the corrected measurement value has the fault. The fault detector detects the fault in the electric circuit, based on a condition that at least one of the first determination device or the second determination device determines that the electric circuit has the fault.

The first determination device compares the uncorrected measurement value with the uncorrected threshold value, in view of the possibility in which the upper limit value or the lower limit value of the corrected measurement value does not exceed the threshold value depending on the individual due to, for example, variation in the respective resistance values of the circuit fault detection elements. In addition, the corrected measurement value is compared with the corrected threshold value. In a situation of determining a fault occurred in the electric circuit through at least one comparison, it is considered that the fault occurred in the electric circuit is detected.

It is possible to detect a fault in the electric circuit even in a situation where the fault in the electric circuit cannot be compared through the comparison between the corrected measurement value and the threshold value. Therefore, the precision of detecting a fault in the electric circuit is enhanced.

First Embodiment

Hereinafter, embodiments will be described with reference to the drawings. FIG. 1 illustrates an electric circuit 10 and an MPU 20. The MPU 20 is a part of an element of a circuit fault detection apparatus for detecting a fault in the electric circuit 10.

The electric circuit 10 includes a power semiconductor device 30, a load 40 and a resistor 50. The power semiconductor device 30 includes a main MOSFET 31 and a sense MOSFET 32. The main MOSFET 31 is a MOSFET (Metal-Oxide-Semiconductor Field Effect Transistor) for controlling a current flowing through the load 40. The sense MOSFET 32 as a MOSFET for current detection is connected in parallel with the main MOSFET 31. The MPU 20 detects a current fault generated in the electric circuit 10 through detecting a value of the current flowing through the sense MOSFET 32. The sense MOSFET 32 is a circuit fault detection element. The power semiconductor device 30 also includes an operational amplifier 33 and a bipolar transistor 34. The load 40 corresponds to, for example, "L" in FIGS. 1, 10.

The main MOSFET 31 has: a source terminal that is connected to the load 40; a drain terminal that is connected to a power supply voltage +B; and a gate terminal that is connected to the MPU 20. The sense MOSFET 32 has: a source terminal that is connected to a collector terminal of the transistor 34 and is connected to an inverting input terminal of the operational amplifier 33; a drain terminal that is connected to the power supply voltage +B; and a gate terminal that is connected to the MPU 20.

The non-inverting input terminal of the operational amplifier 33 is connected to the source terminal of the main MOSFET 31. The transistor 34 has: a base terminal that is connected to an output terminal of the operational amplifier 33; an emitter terminal that is connected to the resistor 50; and a collector terminal that is connected to the source terminal of the sense MOSFET 32.

In the electric circuit 10 having such a configuration, since the output of the operational amplifier 33 is connected to the inverting input terminal, the voltage applied to the inverting input terminal of the operational amplifier 33 is equal to the voltage applied to the non-inverting input terminal. The mathematical expression 1 is satisfied where: RonS is an on-resistance of the sense MOSFET 32; RonK is an on-resistance of the main MOSFET 31; and a main current IOUT is a current flowing through the sense MOSFET 32.

$$RonS*IS=RonK*IOUT \quad \text{(Mathematical Expression 1)}$$

In a situation where the on-resistances RonS, RonK are known values, the main current IOUT can be calculated from the mathematical expression 1 by measuring the sense current IS. The MPU 20 reads out a value acquired by converting the sense current IS to a voltage through the resistor 50.

The MPU 20 includes an I/O port 21, an AD conversion circuit (hereinafter referred to as "ADC") 22, a DA conversion circuit (hereinafter referred to as "DAC") 23, and a CPU 24. The ADC 22 receives a voltage value as an analog value input to the MPU 20, and the voltage value is converted to the digital value D and then output. The digital value D is merely a numerical value and has no unit. The digital D is represented as, for example, a discrete value from 0 to 100. As a voltage conversion coefficient is multiplied to the digital value D, the voltage value represented by the digital D is acquired. The DAC 23 converts a digital signal output from the CPU 24 to an analog signal and then outputs the analog signal.

The CPU 24 determines whether the current flowing through the load 40 has a fault or not based on the magnitude of the digital value D output from the ADC 22 or the voltage value represented by the digital value D. The process of the CPU 24 determining whether or not the current has a fault is defined as a current fault detection process. The digital value D or the voltage value represented by the digital value D is a measurement value measured by the ADC 22.

The fault includes a current value being an excessively large value, in other words, an overcurrent, and a current value being a deficiently small value. The fault where the current value is deficiently small may be assumed that a disconnection occurs. In a situation where the CPU 24 detects the overcurrent, the CPU 24 outputs an off signal to the DAC 23 for turning off the main MOSFET 31 and the sense MOSFET 32. The off signal is converted into an analog signal by the DAC 23, and is input to the respective gate terminals of the main MOSFET 31 and the sense MOSFET 32 through the I/O port 21.

(Current Fault Detection Processing)

The following describes the current fault detection process executed by the CPU 24. The following describes that the CPU 24 executes the current fault detection process by adopting the measured digital value D. In addition, part or all of the functions of the CPU 24 may be realized by using one or more ICs (in other words, as hardware). In addition, a part or all of the functions of the CPU 24 may be realized by a combination of software execution by the CPU and hardware components. There may be a memory (not shown) connected to a storage of the CPU 24.

As described above, the main current IOUT can be calculated from the mathematical expression 1. For the main MOSFET 31 and the sense MOSFET 32, the MOSFETs having product model numbers with suitable catalog values of the on-resistance RonS and RonK are selected. Therefore, the catalog values of the respective on-resistances RonS, RonK are known. The catalog value may also be referred to as a standard resistance value.

(Initial Error Correction)

Since there are individual differences in the on-resistances RonS and RonK, in the current fault detection process, the correction coefficient for correcting the difference in the on-resistances RonS and RonK caused by the individual difference is initially calculated. The errors of the on-resistances RonS and RonK to be corrected initially is defined as an initial error.

Figure 2:
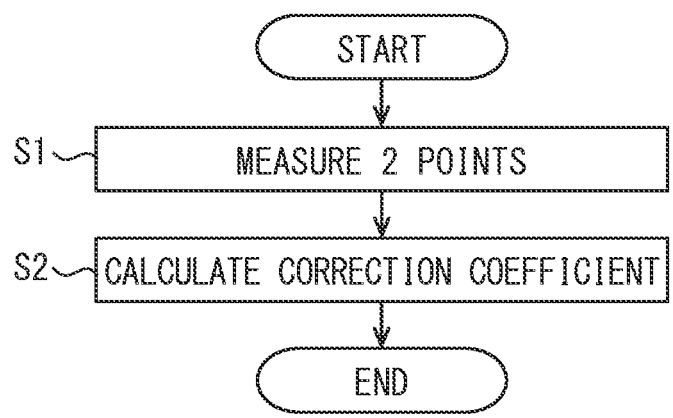
FIG. 2 is a flowchart showing a procedure for calculating a correction coefficient for correcting an initial error.

FIG. 2 is a procedure for calculating a correction coefficient for correcting the initial error. The procedure illustrated in FIG. 2 is executed once by an operator before utilizing the product at, for example, the time of shipment. In S1, the load with a known resistance value is connected to the power semiconductor device 30, and the known power supply voltage is applied to the power semiconductor device 30. Therefore, the main current IOUT can be calculated. The digital value D shown by the ADC 22 is measured. Two types of the load 40 with different resistance values are connected, two sets of the correspondence between the main current IOUT and the digital value D can be acquired by measuring the respective digital values D.

Figure 3:
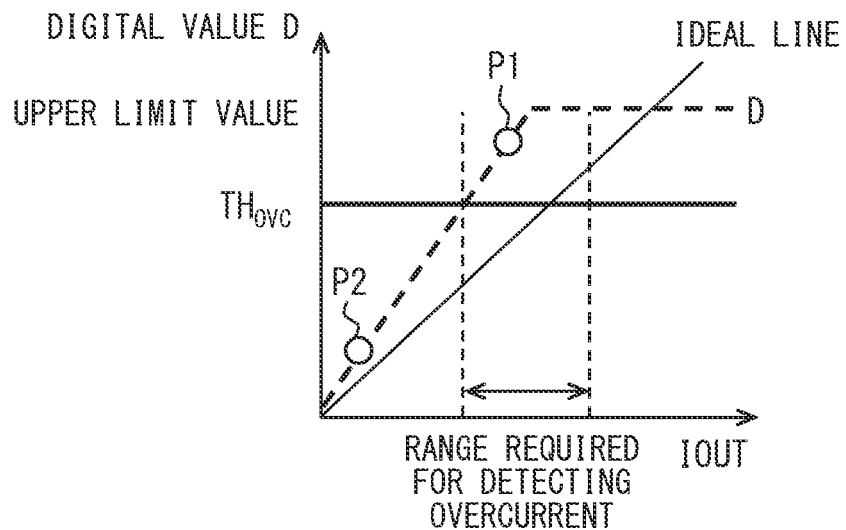
FIG. 3 illustrates an ideal line and a line indicating the relation of a digital value D to a main current IOUT for an actual product.

Two points P1, P2 shown in FIG. 3 are points indicating the correspondence between the main current IOUT and the digital value D acquired in S1. In FIG. 3, an ideal line is illustrated by a solid line. The ideal lines in FIGS. 3 to 5 may also be referred to as "IDEAL". The ideal line indicates the relationship of the digital value D with respect to the main current IOUT as the respective values of the on-resistance RonS, RonK are catalog values.

On the other hand, a straight line indicated by a broken line connecting P1 and P2 is a line showing the relationship of the digital value D with respect to the main current IOUT in an actual product whose digital value D is measured (hereinafter referred to as an "actual product line"). In S2, a correction coefficient for correcting the slope of the actual product line to the slope of the ideal line is calculated. The correction coefficient is stored in a predetermined non-volatile memory included in the MPU 20.

(Setting Overcurrent Threshold Value)

FIG. 3 also shows an overcurrent threshold $TH_{OVC}$ in which the overcurrent is required to be detected. The following describes the overcurrent threshold $TH_{OVC}$ in which the overcurrent is required to be detected. It may be desirable that the overcurrent is detected in a situation where a current slightly exceeds a normal current value. For this purpose, it may be preferable to lower the overcurrent threshold value $TH_{OVC}$ as a threshold value for detecting whether or not the main current IOUT is larger than a normal range, in other words, detecting whether or not an overcurrent is flowing. The main current IOUT is an amount to be measured in the present embodiment.

However, the slope of the actual product line may be larger than the slope of the ideal line, because the on-resistances RonS and RonK may have, for example, an initial error or a temperature error. As the slope is larger, the digital value D gets larger even if the main current IOUT flowing through the actual is identical. In a situation where the overcurrent threshold value $TH_{OVC}$ is set deficiently small, it may be possible that the overcurrent is detected even though the overcurrent does not flow through the actual product with a larger slope of the actual product line. On the other hand, in a situation where the overcurrent threshold value $TH_{OVC}$ is set excessively large, the main current IOUT at a time of detecting the overcurrent becomes excessively large.

In a situation of considering a variety of causes, the main current IOUT required for detecting the overcurrent is within a certain range. This range is a range required for detecting the overcurrent shown in FIG. 3. The range required for detecting the overcurrent is preliminarily set. The overcurrent threshold value $TH_{OVC}$ is set to a value that intersects the ideal line in the range required for detecting the overcurrent. The overcurrent threshold value $TH_{OVC}$ is a constant value that does not depend on the actual product.

(Uncorrected Threshold Value and Corrected Threshold Value)

Since the overcurrent threshold value $TH_{OVC}$ is set to a value that intersects the ideal line, the digital value D to be compared with the overcurrent threshold $TH_{OVC}$ is also required to be corrected to a value as the relationship between the main current IOUT and the digital value D is at the ideal line. Therefore, the correction is executed by multiplying the correction coefficient calculated in S2.

However, the digital value D that can be output by the ADC 22 has an upper limit value determined by the range of input voltage convertible by the ADC 22. As illustrated in FIG. 3, in a case that the upper limit value is not present, even if the ADC 22 receives a voltage value that indicates the main current IOUT having a magnitude exceeding the upper limit value, the output value of the ADC 22 becomes the upper limit value.

Figure 4:
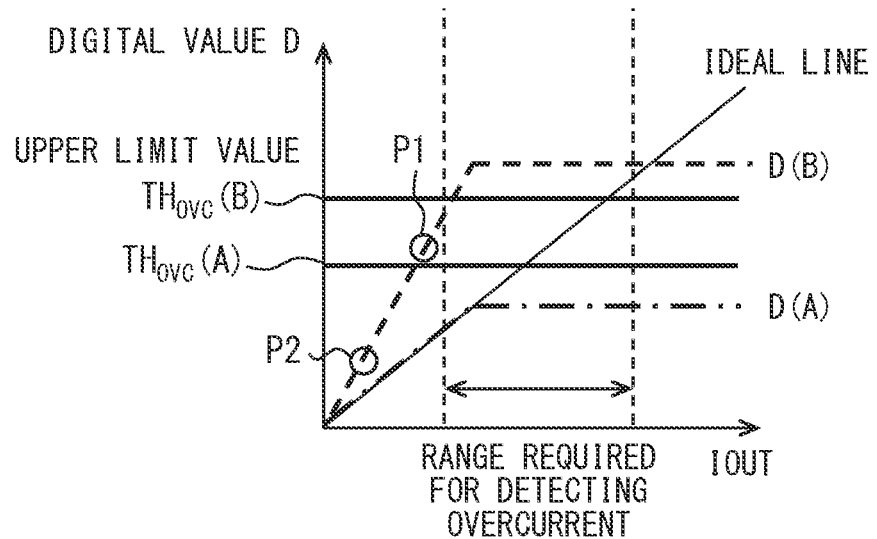
FIG. 4 illustrates a straight line with the largest slope among the straight lines showing the relation of the digital value D to the main current IOUT.

In FIG. 4, a dash-dot line represents a change in the digital value D after correction (hereinafter referred to as a corrected digital value D(A)) with respect to the main current IOUT. The corrected digital value D(A) is an example of a measurement value after correction. In FIG. 4, the upper limit of the corrected digital value D(A) is lower than the corrected overcurrent threshold value $TH_{OVC}(A)$. The corrected overcurrent threshold value $TH_{OVC}(A)$ is an example of a corrected threshold value and an upper corrected threshold value.

In a situation where the upper limit value of the corrected digital value D(A) is at a magnitude smaller than the corrected overcurrent threshold value $TH_{OVC}(A)$, the corrected digital value D(A) does not exceed the corrected overcurrent threshold value $TH_{OVC}(A)$. Regardless of whether or not the overcurrent actually occurs, a situation where the overcurrent cannot be detected occurs.

Another overcurrent threshold value $TH_{OVC}$ is set to compare with the digital value D before correction (hereinafter referred to as the uncorrected digital value D(B)). With regard to two overcurrent threshold values $TH_{OVC}$, the overcurrent threshold value $TH_{OVC}$ for comparing with the uncorrected digital value D(B) is defined as the uncorrected overcurrent threshold value $TH_{OVC}(B)$. The uncorrected overcurrent threshold value $TH_{OVC}(B)$ is an example of a threshold value before correction and an upper uncorrected threshold value.

FIG. 4 also illustrates the uncorrected overcurrent threshold value $TH_{OVC}(B)$. For the actual product line with the largest slope, the uncorrected overcurrent threshold value $TH_{OVC}(B)$ is set to a value slightly larger than the digital value D at a time where the main current IOUT is a lower limit value of a range where the overcurrent is required to be detected. FIG. 4 shows the actual product line having the largest slope.

For the actual product line with the smallest slope, the corrected overcurrent threshold value $TH_{OVC}(A)$ is set to a value slightly larger than the digital value D at a time where the main current IOUT is an upper limit value of a range where the overcurrent is required to be detected.

The range of slope of the actual product line may be preliminarily determined. The slope of the actual product line is RonK/RonS. Although RonK and RonS vary depending on the actual product, both of the main MOSFET 31 and the sense MOSFET 32 are guaranteed to be within a certain range of RonK and RonS according to the product specifications.

In FIG. 4, the uncorrected overcurrent threshold value $TH_{OVC}(B)$ intersects the uncorrected digital value D(B) in a range required for detecting the overcurrent. Even in an actual product in which the corrected digital value D(A) does not exceed the corrected overcurrent threshold value $TH_{OVC}(A)$, in a situation where the uncorrected overcurrent threshold value $TH_{OVC}(B)$ is compared with the uncorrected digital value D(B), the overcurrent detection can be understood in a range required for detecting the overcurrent.

Figure 5:
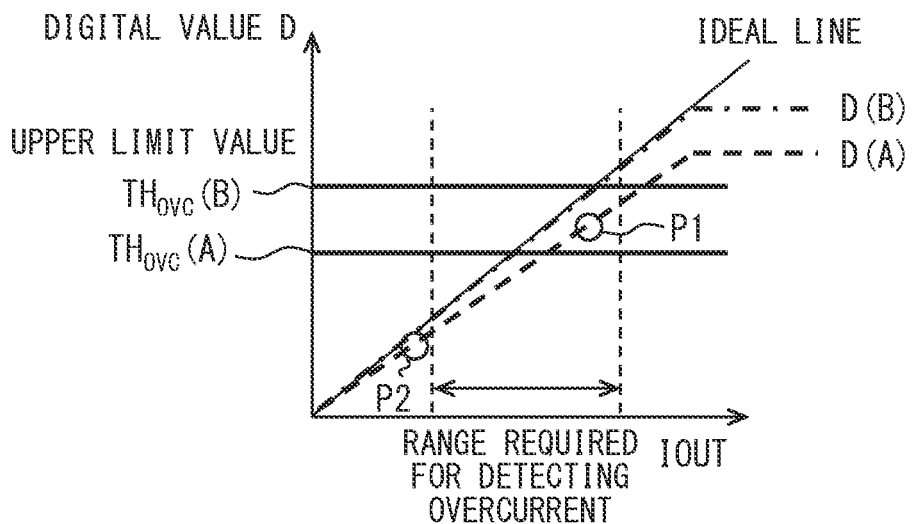
FIG. 5 illustrates a straight line with the smallest slope among the straight lines showing the relation of the digital value D to the main current IOUT.

FIG. 5 illustrates an actual product line having the smallest slope. In FIG. 5, a broken line represents a uncorrected actual product line, and a dash-dot line represents a change in the corrected digital value D(A) with respect to the main current IOUT. In other words, the dash-dot line is the corrected actual product line.

As illustrated in FIG. 5, in the actual product line with the smallest slope, contrary to FIG. 4, the uncorrected digital value D(B) exceeds the uncorrected overcurrent threshold value $TH_{OVC}(B)$ in a situation where the main current OUT is larger than a range required for detecting the overcurrent. Therefore, in the actual product indicating the actual product line with the smallest slope, the overcurrent cannot be detected in a range required for detecting the overcurrent even if adopting the uncorrected threshold value $TH_{OVC}(B)$.

For the actual product indicating the actual product line having the smallest slope, in a situation where the main current IOUT is within a range required for detecting the overcurrent, the corrected digital value D exceeds the corrected overcurrent threshold value $TH_{OVC}(A)$. Therefore, in the actual product indicating the actual product line with the smallest slope, the overcurrent can be detected in a range required for detecting the overcurrent in a situation where the corrected digital value D is compared with the corrected current threshold value $TH_{OVC}(A)$. The uncorrected overcurrent threshold value $TH_{OVC}(B)$ and the corrected overcurrent threshold value $TH_{OVC}(A)$ are constant values not depending on the actual product because the variation in the on-resistances RonS, RonK in the actual product are taken into consideration, and are preliminarily set.

(Current Fault Detection Processing)

Figure 6:
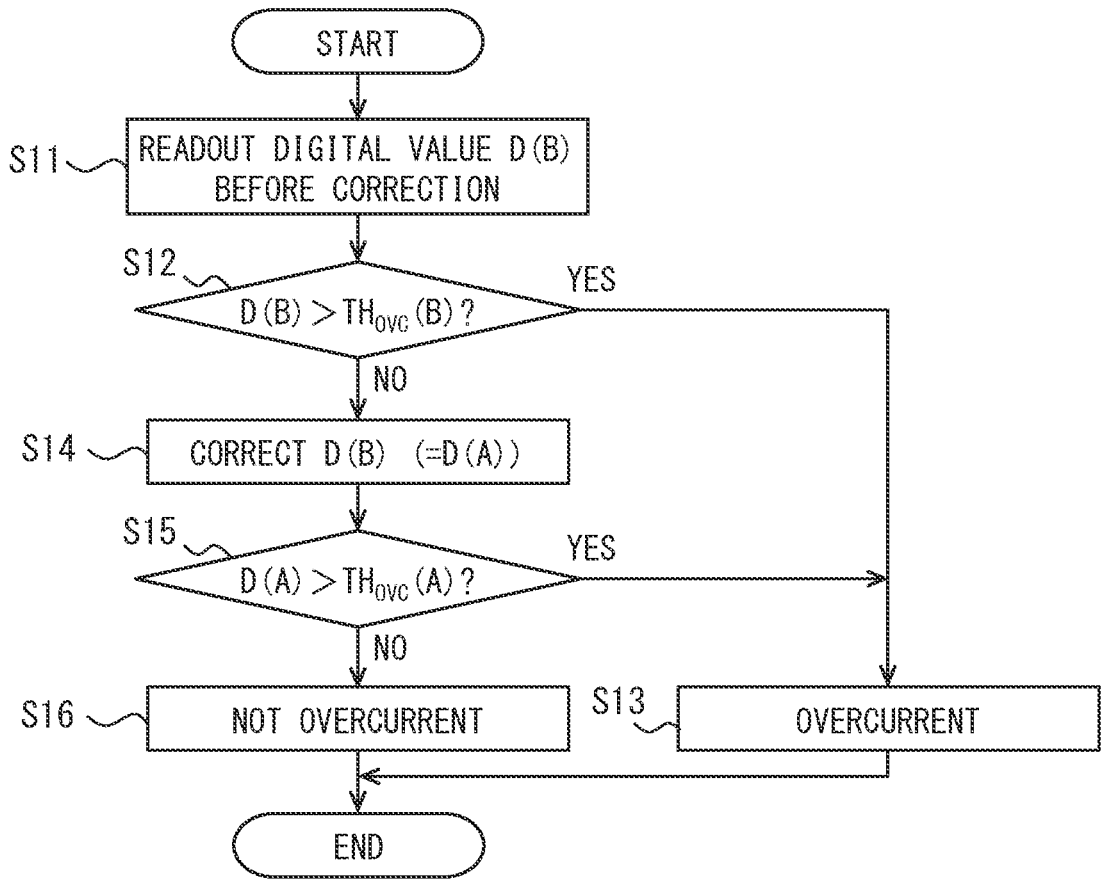
FIG. 6 illustrates an overcurrent detection process executed by a CPU.

Based on the above description, in the present embodiment, the overcurrent is detected by adopting two threshold values which are the uncorrected overcurrent threshold value $TH_{OVC}(B)$ and the corrected overcurrent threshold value $TH_{OVC}(A)$. FIG. 6 shows an overcurrent detection process executed by the CPU 24. The CPU 24 executes the process shown in FIG. 6 at regular intervals while in an electrical conduction state. In the process illustrated in FIG. 6, S12 corresponds to a first determination device, S13 and S16 correspond to a fault detector, S14 corresponds to a corrector, and S15 corresponds to a second determination device.

In S11, the ADC 22 reads out the uncorrected digital value D(B). In S12, it is determined whether or not the uncorrected digital value D(B) readout in S11 is larger than the uncorrected overcurrent threshold value $TH_{OVC}(B)$. The determination proceeds to S13 in a situation of YES. In S13, it is assumed that an overcurrent is detected. Subsequently, the OFF signal for turning off the main MOSFET 31 and the sense MOSFET 32 is output to the DAC 23.

If the determination in S12 is NO, the process proceeds to S14. In S14, a correction by multiplying the correction coefficient calculated in S2 to the uncorrected digital value D(B) readout in S11 is executed. Therefore, the corrected digital value D(A) is acquired. The correction coefficient is a coefficient for adjusting the slope of the actual product line to the slope of the ideal line, and the slope of the actual product line and the ideal line represents the ratio of the on-resistance RonS to the on-resistance RonK. The correction through multiplying the correction coefficient to the uncorrected digital value D(B) is a correction for adjusting the uncorrected digital value D(B) to a value in a situation where the on-resistances RonS, RonK of the actual product are catalog values (in other words, standard resistance values).

In S15, it is determined whether or not the corrected digital value D(A) acquired in S14 is larger than the corrected overcurrent threshold value $TH_{OVC}(A)$. In a situation where the determination is YES, the process proceeds to S13 and it is considered that the overcurrent is detected. On the other hand, in a situation where the determination in S15 is NO and the process proceeds to S16, it is considered as a situation where the overcurrent does not occur.

In the present embodiment described above, the uncorrected digital value D(B) is compared with the uncorrected overcurrent threshold value $TH_{OVC}(B)$ in S12, in view of the possibility in which the upper limit value of the corrected digital value D(A) does not exceed the corrected overcurrent threshold value $TH_{OVC}(A)$ due to, for example, variation in the resistance value of the sense MOSFET 32. Additionally, the corrected digital value D(A) is also compared with the corrected overcurrent threshold value $TH_{OVC}(A)$ in S15. In at least one comparison, in a situation where it is determined that the digital value D exceeds the overcurrent threshold value $TH_{OVC}$, it is considered that the overcurrent flows through the electric circuit 10 in S13.

Even in a situation where the overcurrent flowing through the electric circuit 10 cannot be detected in the comparison between the corrected digital value D(A) and the corrected overcurrent threshold value $TH_{OVC}(A)$, the overcurrent flowing through the electric circuit 10 can be detected. Therefore, the precision of detecting a fault in the electric circuit is enhanced.

Second Embodiment

The following describes the second embodiment. In the description of the second and subsequent embodiments, elements having the same reference numerals as those used so far are identical to the elements having the same reference numerals in the previous embodiment(s), unless otherwise specified. When only a part of the configuration is described, the embodiment described above can be applied to other parts of the configuration.

Figure 7:
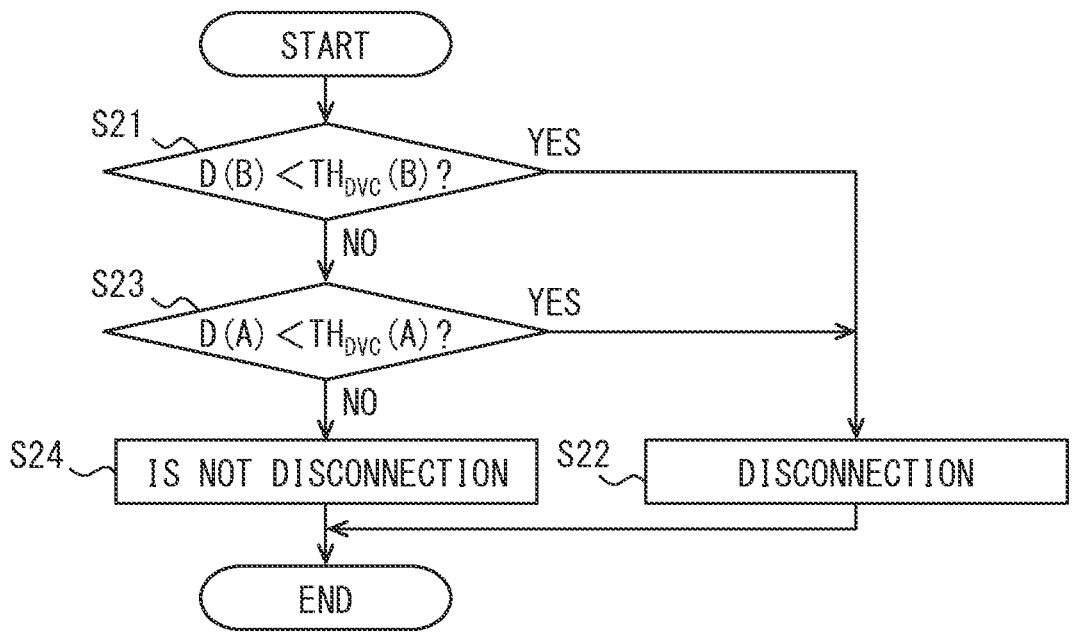
FIG. 7 illustrates a disconnection detection process executed by the CPU.

The second embodiment is different from the first embodiment in that the CPU 24 executes a disconnection detection process illustrated in FIG. 7 subsequent to the overcurrent detection process illustrated in FIG. 6. In a situation where a disconnection occurs in the electric circuit 10, the current value drops. Therefore, in a situation where the digital value D is lower than a threshold value set for disconnection detection, it can be considered that the disconnection occurs.

Even in a situation where the threshold value for disconnection detection is compared with the digital value D, a situation caused by, for example, variation in the on-resistances RonS, RonK occurs as similar to a situation of overcurrent detection. In other words, even when the disconnection occurs at the electric circuit 10, it is possible that the corrected digital value D(A) is not lower than a corrected disconnection threshold $TH_D(A)$ set for disconnection detection. This is because there is a lower limit value determined by the variation in resistance values such as the on-resistances RonS, RonK and the range of input voltage convertible by the ADC 22. The corrected disconnection threshold value $TH_D(A)$ is an example of a corrected threshold value and an upper corrected threshold value.

In FIGS. 3-5 the ideal line and the actual product line rise from the vicinity of the intersection of the two axes. The main current IOUT at the point where the ideal line and the actual product line rise can also be set to 0 mA. In other words, the lower limit value detectable by the ADC 22 can be set to a value corresponding to the main current IOUT=0 mA. The lower limit value detectable by the ADC 22 can be set to a value corresponding to the main current IOUT larger than 0 mA to, for example, enhance the resolution of fault detection.

In a situation where the lower limit value detectable by the ADC 22 is set to a value corresponding to the main current IOUT larger than 0 mA, it is possible that the corrected digital value D(A) is not lower than the corrected disconnection threshold value $TH_D(A)$.

Regarding the disconnection detection process, not only the corrected digital value D(A) to be compared with the corrected digital value D(A), but also the uncorrected disconnection threshold value $TH_D(B)$ to compared with the uncorrected digital value D(B) is preliminarily set. The uncorrected disconnection threshold value $TH_D(B)$ is an uncorrected threshold value and a lower uncorrected threshold value.

FIG. 7 illustrates the disconnection detection process executed by the CPU 24. In a situation where there is no overcurrent detected in the overcurrent detection process, the CPU 24 executes the process shown in FIG. 7. In the process illustrated in FIGS. 7, S12 and S21 correspond to a first determination device, S22 and S24 correspond to a fault detector, and S23 corresponds to a second determination device.

S21 determines whether or not the uncorrected digital value D(B) readout in S11 is smaller than the uncorrected disconnection threshold value $TH_D(B)$. The determination proceeds to S22 in a situation of YES. In S22, it is considered that the disconnection is detected. A fault indicator lamp may be provided at a position visible from the outside of the device, and the fault indicator lamp may be turned on in a situation of detecting the disconnection.

In a situation where the determination in S21 is NO, the process proceeds to S23. S23 determines whether or not the corrected digital value D(A) acquired in S14 is smaller than the corrected disconnection threshold value $TH_D(A)$. In a situation where the determination in S23 is YES, the process proceeds to S22 and it is considered that the disconnection is detected. On the other hand, in a situation where the determination in S23 is NO, the process proceeds to S24 and it is considered that the disconnection does not occur.

In the second embodiment, the uncorrected digital value D(B) is compared with the uncorrected disconnection threshold value $TH_D(B)$ in S21, in view of the possibility that the lower limit value of the corrected digital value D(A) is not smaller than the corrected disconnection threshold value $TH_D(A)$. In addition, the corrected digital value D(A) is compared with the corrected disconnection threshold value $TH_D(A)$ in S23. In at least one comparison, in a situation where it is determined that the digital value D is lower than the disconnection threshold value $TH_D$, it is considered that the electric circuit 10 has disconnection in S22.

Therefore, even in a situation where the disconnection in the electric circuit 10 cannot be detected through the comparison between the corrected digital value D(A) and the corrected disconnection threshold value $TH_D(B)$, the disconnection in the electric circuit 10 can be detected. Therefore, the precision of detecting the disconnection in the electric circuit 10 is enhanced.

Although the embodiments of the present disclosure have been described above, the present disclosure is not limited to the above embodiments, and various modified examples described below are also included in the technical scope of the present disclosure. Furthermore, various modifications other than the following can be made without departing from the gist.

(First Modification)

Figure 8:
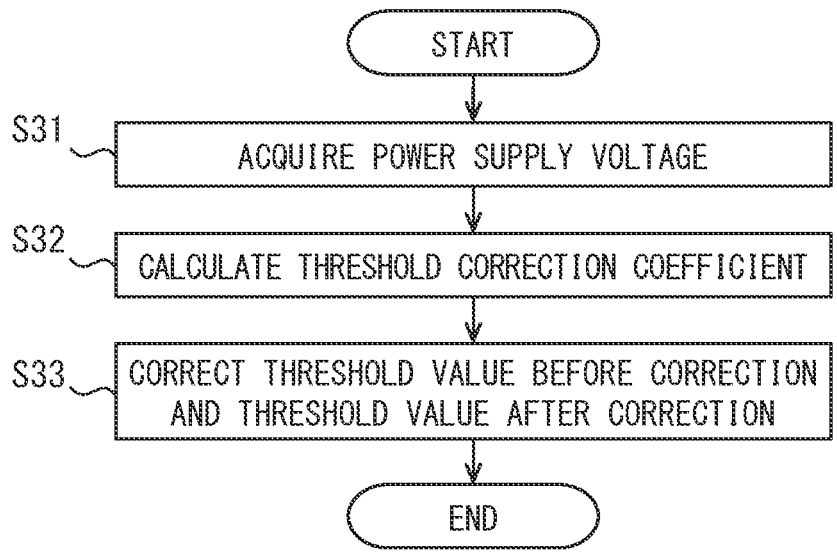
FIG. 8 illustrates a process executed by the CPU in a first modification.

In a first modification, in addition to the first embodiment or the second embodiment, the CPU 24 further executes the process shown in FIG. 8. The process shown in FIG. 8 is periodically executed at a cycle equal to or longer than the execution cycle in FIG. 6. The processes shown in FIG. 8, that is, S31 to S33 are processes as a threshold value corrector.

S31 acquires the value of the power supply voltage +B. A calculator separately provided from the MPU 20 sequentially measures the power supply voltage +B, in a situation where the calculator and the MPU 20 are mutually connected, the calculator can acquire the value of the power supply voltage +B. The MPU 20 may also measure the power supply voltage +B. In a situation where the MPU 20 measures the power supply voltage +B, the MPU 20 includes an ADC for measuring the power supply voltage +B.

S32 calculates a threshold correction coefficient. The threshold correction coefficient is acquired through dividing the value of the power supply voltage +B acquired in S31 by the reference value of the power supply voltage +B. In S33, the threshold value correction coefficient acquired in S32 is multiplied to the uncorrected overcurrent threshold value $TH_{OVC}(B)$ and the corrected overcurrent threshold value $TH_{OVC}(A)$ adopted in FIG. 6. In a situation of executing the process shown in FIG. 7, the threshold correction coefficient acquired in S32 is multiplied to the uncorrected disconnection threshold value $TH_D(B)$ and the corrected disconnection threshold value $TH_D(A)$. In FIGS. 6 and 7 the newest threshold value TH corrected by the executing the process in FIG. 8 is adopted.

In the first modification, the uncorrected threshold value and the corrected threshold value are scaled with an identical ratio according to the magnitude of the power supply voltage +B as a voltage input to the electric circuit 10. In a situation of scaling the overcurrent threshold value $TH_{OVC}$ and the disconnection threshold value $TH_D$ according to the power supply voltage +B, it is possible to collectively scale the uncorrected and corrected overcurrent threshold value $TH_{OVC}$ and the uncorrected and corrected disconnection threshold value $TH_D$.

(Second Modification)

Figure 9:
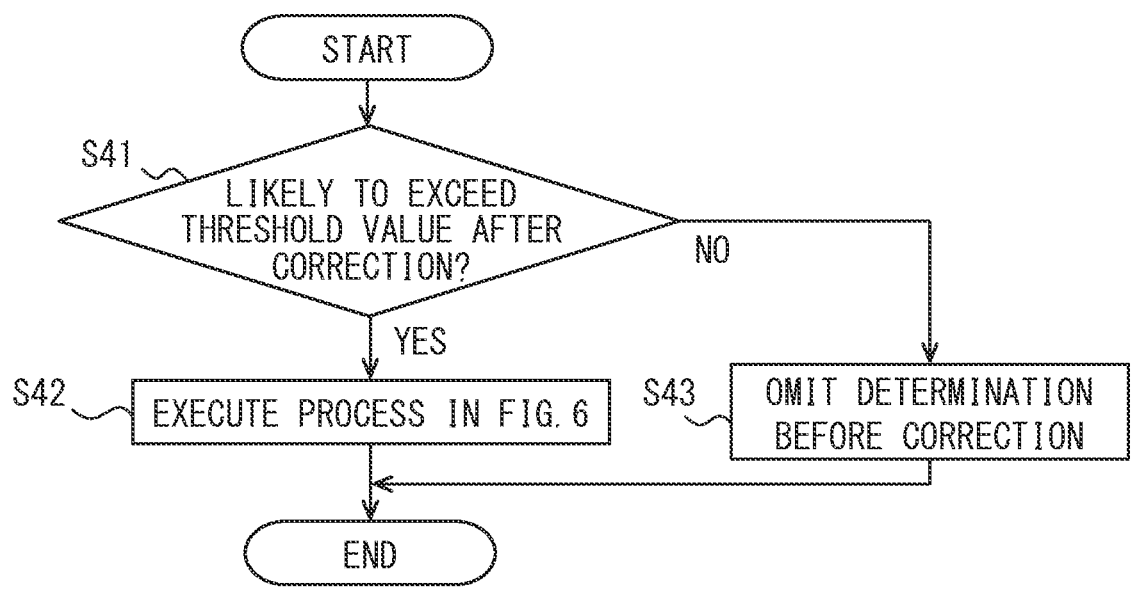
FIG. 9 illustrates a process once executed before the CPU executing the process in FIG. 6 in a second modification.

In a second modification, the CPU 24 executes the process shown in FIG. 9 once before executing the process shown in FIG. 6. When the process shown in FIG. 9 is executed, the actual product line has already been calculated in FIG. 2.

S41 determines whether or not the corrected digital value D(A) is likely to exceed the corrected overcurrent threshold value $TH_{OVC}(A)$. As can be understood from the comparison in FIGS. 4 and 5, the corrected digital value D(A) does not exceed the corrected overcurrent threshold value $TH_{OVC}(A)$ when the slope of the actual product line is larger, and the corrected digital value D(A) exceeds the corrected overcurrent threshold value $TH_{OVC}(A)$ when the slope of the actual product line is smaller. The corrected overcurrent threshold value $TH_{OVC}(A)$ and the upper limit value are constant values. The slope of the actual product line, at which the corrected digital value D(A) does not exceed the corrected current threshold value $TH_{OVC}(A)$, can be preliminarily calculated.

In a situation where the slope of the actual product line at which the corrected digital value D(A) does not exceed the corrected overcurrent threshold value $TH_{OVC}(A)$ is defined as $\alpha 0$, S41 determines whether or not the slope of the actual product line calculated by executing the procedure in FIG. 2 is larger than $\alpha 0$. If the slope of the actual product line is $\alpha 0$ or less, the determination of S41 is YES, and the process proceeds to S42.

S42 subsequently determines to execute the process shown in FIG. 6 as the overcurrent detection process. On the other hand, in a situation where the slope of the actual product line is larger than $\alpha 0$, the determination in S41 is NO and the process proceeds to S43. S43 determines to omit the pre-correction determination in the overcurrent detection process. The pre-correction determination is S12 in FIG. 6, and the overcurrent detection process omitting the pre-correction determination is a process omitting S12 from FIG. 6. Since it is possible that the corrected digital value D(A) exceeds the corrected overcurrent threshold value $TH_{OVC}(A)$, it is possible to detect the overcurrent even if omitting the comparison between the uncorrected digital value D(B) and the uncorrected overcurrent threshold value $TH_{OVC}(B)$. Therefore, the comparison between the uncorrected digital value D(B) and the uncorrected overcurrent threshold $TH_{OVC}(B)$ is not executed. In a situation where the corrected digital value D(A) exceeds the corrected overcurrent threshold value $TH_{OVC}(A)$, it is considered that the overcurrent is flowing in the electric circuit 10.

If the second modification is configured, it is possible to simplify the overcurrent detection process executed periodically. Since the MPU 20 has a configuration for comparing the uncorrected digital value D(B) and the uncorrected overcurrent threshold value $TH_{OVC}(B)$, even if the MPU 20 is applied to an actual product having a larger slope of the actual product line, the MPU 20 has versatility to detect the overcurrent with enhanced accuracy.

(Third Modification)

Figure 10:
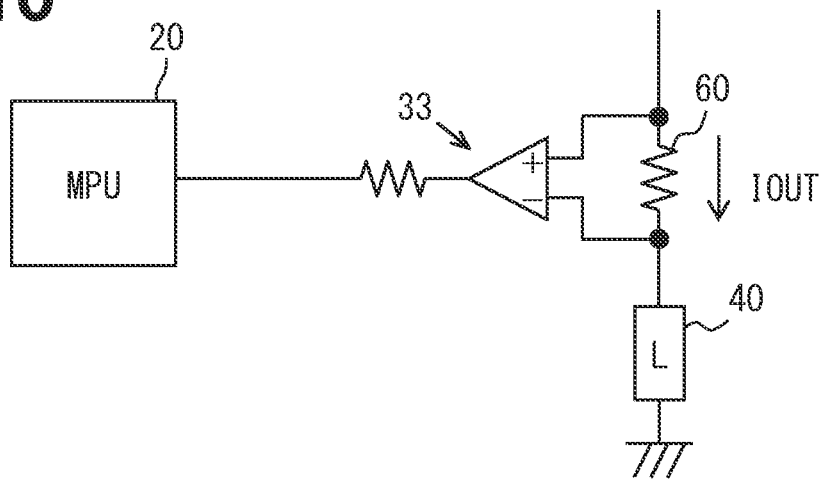
FIG. 10 illustrates a circuitry configuration in a third modification.

In the embodiments, the sense MOSFET 32 is a circuit fault detection element. However, the circuit fault detection element is not limited to the sense MOSFET 32. In FIG. 10, a resistor 60 is provided as a circuit fault detection element. In FIG. 10, the inverting input terminal of the operational amplifier 33 is connected to a first end of the resistor 60, and the non-inverting input terminal of the operational amplifier 33 is connected to a second end of the resistor 60. The output of the operational amplifier 33 is input to the MPU 20. Even with the above configuration, it is possible to determine whether or not the current flowing through the electric circuit including the load 40 has a fault.

(Fourth Modification)

Figure 11:
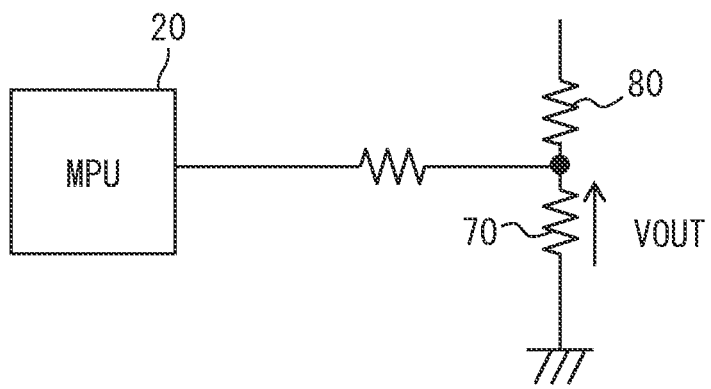
FIG. 11 illustrates a circuitry configuration in a fourth modification.

With regard to the above description, although the ADC 22 directly measures the voltage value, the target measurement value is the current, and the voltage value indicating the magnitude of the current value is detected by the ADC 22. However, the target measurement value may also be the voltage. In FIG. 11, a resistor 70 is provided as the circuit fault detection element. The MPU 20 detects a voltage applied to an end of the resistor 70 through the ADC 22. Therefore, it is possible to detect a voltage fault in the electric circuit having the resistor 70.

(Fifth Modification)

With regard to the above description, the digital value D is compared with the threshold value TH. However, a fault in the electric circuit 10 may also be detected by comparing the voltage value, which is acquired by multiplying the voltage conversion coefficient to the digital value D, with the threshold value TH set for the voltage value. The voltage value, which is acquired by multiplying the voltage conversion coefficient to the digital value D, is an example of the measurement values.

The process of the flowchart or the flowchart described in this application includes a plurality of sections, and each section is expressed as, for example, S1. Each section may be divided into several subsections, while several sections may be combined into one section. Furthermore, each section thus configured may be referred to as a device, module, or means.

Although the present disclosure has been made in accordance with the embodiments, it is understood that the present disclosure is not limited to such embodiments and structures. The present disclosure encompasses various modifications and variations within the scope of equivalents. In addition, while the various elements are shown in various combinations and configurations, which are exemplary, other combinations and configurations, including more, less or only a single element, are also within the spirit and scope of the present disclosure.

What is claimed is:

1. A circuit fault detection apparatus for detecting a fault in an electric circuit, comprising:
    an AD conversion circuit configured to detect a voltage corresponding to a current flowing through a circuit fault detection element connected to the electric circuit or a voltage applied to the circuit fault detection element, and convert the voltage to a digital value;
    a corrector configured to correct the digital value output by the AD conversion circuit or a measurement value as a voltage value representative of the digital value to a corrected measurement value as a value in a situation where a resistance value of the circuit fault detection element is preliminarily set to a standard resistance value;
    a first determination device configured to determine whether or not the electric circuit has the fault, based on a comparison between an uncorrected measurement value that is the measurement value before corrected by the corrector and an uncorrected threshold value for determining whether or not the uncorrected measurement value has the fault;
    a second determination device configured to determine whether or not the electric circuit has the fault, based on a comparison between the corrected measurement value and a corrected threshold value for determining whether or not the corrected measurement value has the fault; and
    a fault detector configured to detect the fault in the electric circuit, based on a condition that at least one of the first determination device or the second determination device determines that the electric circuit has the fault.

2. The circuit fault detection apparatus according to claim 1,
    wherein an upper uncorrected threshold value is provided as the uncorrected threshold value for determining whether or not the uncorrected measurement value is larger than an upper limit of a normal range,
    wherein an upper corrected threshold value is provided as the corrected threshold value for determining whether or not the corrected measurement value is larger than the upper limit of the normal range,
    wherein the first determination device is further configured to determine that the fault in which a measurement target quantity is excessively large occurs, based on a condition that the uncorrected measurement value is larger than the upper uncorrected threshold value, the measurement target quantity is one of a current flowing through the electric circuit and a voltage applied to the electric circuit, and
    wherein the second determination device is further configured to determine the fault in which a measurement target quantity is excessively large occurs, based on a condition that the corrected measurement value is larger than the upper corrected threshold value.

3. The circuit fault detection apparatus according to claim 1, further comprising:
    a threshold value corrector configured to respectively scale the uncorrected threshold value and the corrected threshold value to an uncorrected threshold scaled value and a corrected threshold scaled value at an identical ratio according to a voltage input to the electric circuit,
    wherein the first determination device is further configured to adopt the uncorrected threshold scaled value as the uncorrected threshold value, and
    wherein the second termination device is further configured to adopt the corrected threshold scaled value as the corrected threshold value.

4. The circuit fault detection apparatus according to claim 2,
    wherein the first determination device does not determine whether or not the electric circuit has the fault, based on a condition that the first determination device determines that the corrected measurement value is likely to exceed the corrected threshold value according to a slope of a relation of the uncorrected measurement value to the target measurement quantity, and wherein the fault detector determines that the electric circuit has the fault, in response to the second determination device determining that the electric circuit has the fault.

5. The circuit fault detection apparatus according to claim 1,
wherein a lower uncorrected threshold value for determining whether or not the uncorrected measurement value is lower than a lower limit of a normal range is provided as the uncorrected threshold value,
wherein a lower corrected threshold value for determining whether or not the corrected measurement value is lower than a lower limit of a normal range is provided as the corrected threshold value,
wherein the first determination device is configured to determine that the electric circuit has disconnection as the fault, based on a condition that the uncorrected measurement value is lower than the lower uncorrected threshold value, and
wherein the second determination device is configured to determine that the electric circuit has the disconnection as the fault, based on a condition that the corrected measurement value is lower than the lower corrected threshold value.

6. A circuit fault detection apparatus for detecting a fault in an electric circuit, comprising:
an AD conversion circuit configured to detect a voltage corresponding to a current flowing through a circuit fault detection element connected to the electric circuit or a voltage applied to the circuit fault detection element, and convert the voltage to a digital value; and
a microprocessor configured to:
correct a measurement value as the digital value output by the AD conversion circuit or a voltage value representative of the digital value to a corrected measurement value as a value in a situation where a resistance value of the circuit fault detection element is preliminarily set to a standard resistance value;
determine whether or not the electric circuit has the fault, based on a first comparison between an uncorrected measurement value that is the measurement value before corrected and an uncorrected threshold value for determining whether or not the uncorrected measurement value has the fault;
determine whether or not the electric circuit has the fault, based on a second comparison between the corrected measurement value and a corrected threshold value for determining whether or not the corrected measurement value has the fault; and
detect the fault in the electric circuit, based on a condition that at least one of the first comparison or the second comparison indicates that the electric circuit has the fault.

* * * * *